US005817546A

United States Patent [19]
Ferla et al.

[11] Patent Number: 5,817,546
[45] Date of Patent: Oct. 6, 1998

[54] PROCESS OF MAKING A MOS-TECHNOLOGY POWER DEVICE

[75] Inventors: Giuseppe Ferla, Catania; Ferruccio Frisina, Sant'Agata Li Battiati, both of Italy

[73] Assignees: STMicroelectronics S.r.l., Agrate Brianza; Consorzio per la Ricerca sulla Microelettronica nel Mezzogiorno, Catania, both of Italy

[21] Appl. No.: 576,989

[22] Filed: Dec. 19, 1995

Related U.S. Application Data

[63] Continuation-in-part of Ser. No. 493,149, Jun. 21, 1995.

[30] Foreign Application Priority Data

Jun. 23, 1994 [EP] European Pat. Off. .............. 94830315

[51] Int. Cl.⁶ .................. H01L 21/332; H01L 21/336
[52] U.S. Cl. ............... 438/138; 438/268; 148/DIG. 126
[58] Field of Search ................................ 437/6, 40–41, 437/44; 148/DIG. 126; 438/133, 138, 268

[56] References Cited

U.S. PATENT DOCUMENTS

| | | | |
|---|---|---|---|
| 3,319,311 | 5/1967 | Mutter | 29/25.3 |
| 3,461,360 | 8/1969 | Barson et al. | 317/235 |
| 3,764,396 | 10/1973 | Tarui et al. | 148/1.5 |

(List continued on next page.)

FOREIGN PATENT DOCUMENTS

| | | | |
|---|---|---|---|
| A-1 123 119 | 5/1982 | Canada | H01L 29/04 |
| A-1 136 291 | 11/1982 | Canada | H01L 29/94 |
| A-0 304 839 | 3/1989 | European Pat. Off. | H01L 21/28 |
| A-0 368 246 | 5/1990 | European Pat. Off. | H01L 29/72 |
| A-0 405 138 | 1/1991 | European Pat. Off. | H01L 29/72 |
| A-0 407 011 | 1/1991 | European Pat. Off. | H01L 29/16 |
| A- 49-14391 | 4/1974 | Japan | H01L 11/14 |
| A-51-48981 | 4/1976 | Japan | H01L 29/78 |
| A-51-134076 | 11/1976 | Japan | H01L 29/78 |
| A-52-106688 | 9/1977 | Japan | H01L 29/78 |
| A-54-885 | 9/1977 | Japan | H01L 29/78 |
| A-53-66181 | 6/1978 | Japan | H01L 29/78 |
| A-53-135284 | 11/1978 | Japan | H01L 29/78 |
| 5265943 | 1/1979 | Japan . | |
| 162677/75 | 6/1980 | Japan . | |
| A-2 087 648 | 5/1982 | United Kingdom | H01L 23/00 |

OTHER PUBLICATIONS

Proceedings of the IEEE. vol. 51, Sep. 1963 S.R. Hofstein, et al. "The Silicon Insulated–Gate Field–Effect Transistor", pp. 1190–1202.

IEEE Journal of Solid–State Circuits, vol. SC–10, No. 5, Oct. 1975, T.J. Rogers, et al., "An Experimental and Theoretical Analysis of Double–Diffused MOS Transistors", pp. 322–331.

(List continued on next page.)

*Primary Examiner*—John Niebling
*Assistant Examiner*—Richard A. Booth
*Attorney, Agent, or Firm*—Wolf, Greenfield & Sacks, P.C.

[57] ABSTRACT

A process forms a MOS-technology power device including a semiconductor material layer of a first conductivity type and a body region disposed therein. The body region includes a heavily doped region of a second conductivity type, a lightly doped region of the second conductivity type and a heavily doped region of the first conductivity type. The process includes forming an insulated gate layer on portions of the surface of the semiconductor material layer to leave selected portions of the semiconductor material layer exposed. A dopant of the second conductivity type is implanted twice at different concentrations and energies into the selected regions of the semiconductor material layer. The implanted ions are thermally diffused to form body regions, each body region including a heavily doped region substantially aligned with the edges of the insulated gate layer, and a lightly doped region formed by lateral diffusion of the first dopant under the insulated gate layer. A dopant of the first conductivity type is then implanted into the heavily doped regions to form source regions substantially aligned with the edges of the insulated gate layer.

30 Claims, 4 Drawing Sheets

U.S. PATENT DOCUMENTS

| | | | |
|---|---|---|---|
| 3,821,776 | 6/1974 | Havashi et al. | 357/23 |
| 3,845,495 | 10/1974 | Cauge et al. | 357/23 |
| 3,909,320 | 9/1975 | Gauge et al. | 148/187 |
| 3,950,777 | 4/1976 | Tarui et al. | 357/23 |
| 3,986,903 | 10/1976 | Watrous, Jr. | 148/187 |
| 4,001,860 | 1/1977 | Cauge et al. | 357/23 |
| 4,055,884 | 11/1977 | Jambotkar | 29/571 |
| 4,142,197 | 2/1979 | Dingwall | 357/23 |
| 4,145,700 | 3/1979 | Jambotkar | 357/23 |
| 4,190,850 | 2/1980 | Tihanvi et al. | 357/23 |
| 4,199,774 | 4/1980 | Plummer | 357/41 |
| 4,233,615 | 11/1980 | Takemoto et al. | 357/22 |
| 4,344,081 | 8/1982 | Pao et al. | 357/43 |
| 4,345,265 | 8/1982 | Blanchard | 357/23 |
| 4,376,286 | 3/1983 | Lidow et al. | 357/23 |
| 4,399,449 | 8/1983 | Herman et al. | 357/53 |
| 4,454,523 | 6/1984 | Hill | 357/15 |
| 4,549,193 | 10/1985 | Malhi et al. | 357/22 |
| 4,593,302 | 6/1986 | Lidow et al. | 357/23.4 |
| 4,642,666 | 2/1987 | Lidow et al. | 357/23.4 |
| 4,680,853 | 7/1987 | Lidow et al. | 29/571 |
| 4,705,759 | 11/1987 | Lidow et al. | 437/29 |
| 4,716,126 | 12/1987 | Cogan | 437/24 |
| 4,794,436 | 12/1988 | Blanchard | 357/23.8 |
| 4,798,810 | 1/1989 | Blanchard et al. | 437/29 |
| 4,952,992 | 8/1990 | Blanched | 357/23.4 |
| 4,971,921 | 11/1990 | Fukunaga et al. | 437/29 |
| 4,974,059 | 11/1990 | Kinzer | 357/23.4 |
| 5,191,396 | 3/1993 | Lidow et al. | 257/339 |
| 5,338,961 | 8/1994 | Lidow et al. | 257/342 |
| 5,451,531 | 9/1995 | Yamaguchi et al. | 437/31 |
| 5,529,940 | 6/1996 | Yamamoto et al. | 437/40 |

OTHER PUBLICATIONS

Integrated Circuits Laboratory Standford Electronics Laboratories, Standford University, Technical Report No. 4956–1, Mar., 1976, Michael D. Pocha, High Voltage Double Diffused MOS Transistors For Integrated Circuits, pp. 1–244.

IEEE Transactions on Electron Devices, vol. FD–31, No. 1, Jan. 1984, J.G. Mena, et al., "Breakdown Voltage Design Considerations in VDMOS Structures", pp. 109–113.

Intel Corporation, Mountain View, University of California, Berkeley, John Wiley & Sons, A.S. Grove "Physics and Technology of Semiconductor Devices", 1985 Month unknown.

Patent Abstracts of Japan, JP–A–52 65943 Jan. 6, 1979 (Nippon Denki K.K.).

The Theory and Practice of Micro–electronics, Chapters 4, 6, 8, 10, 13, and 15 Grandi, 1983, Month unknown.

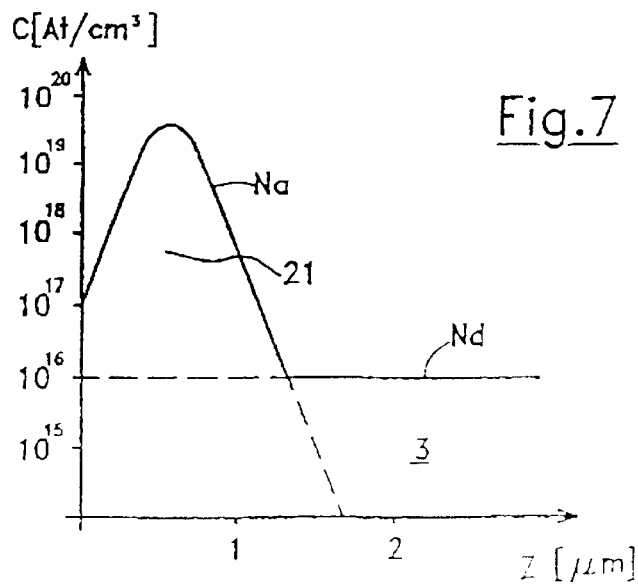
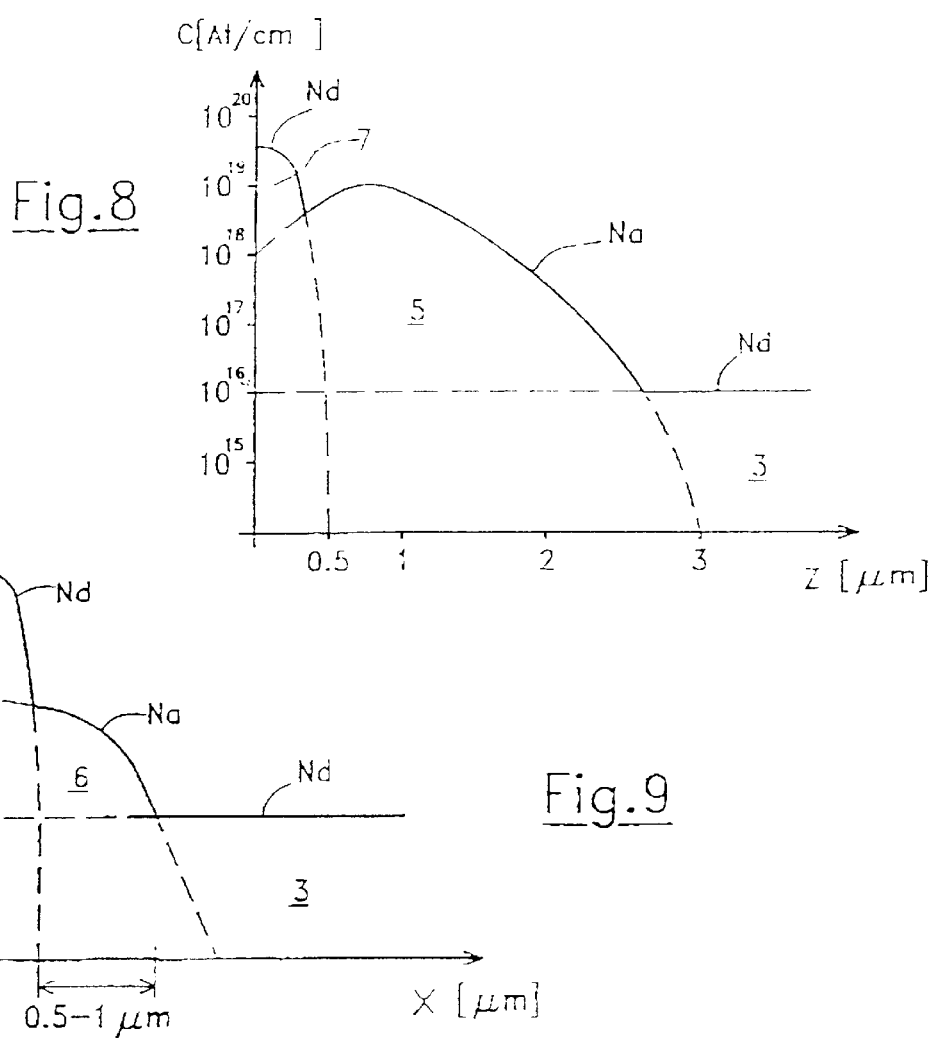

PROCESS OF MAKING A MOS-TECHNOLOGY POWER DEVICE

CROSS-REFERENCE TO RELATED APPLICATION

This application is a continuation-in-part application of U.S. Ser. No. 08/493,149 filed Jun. 21, 1995.

BACKGROUND OF THE INVENTION

1. Field of the Invention

The present invention relates to MOS-technology power devices and their processes of manufacture.

2. Discussion of the Related Art

MOS-technology power devices (such as power MOSFETs and IGBTs) are made up of a plurality of elementary functional units connected in parallel to conduct a fraction of the overall power device current to each unit.

Each elementary functional unit includes a body region of one conductivity type (P type for an N-channel device) formed in a lightly doped semiconductor layer of an opposite conductivity type (N type) common to all the functional units. A heavily doped source region of the opposite conductivity type (N type) is provided inside the body region. The portion of the body region between the source region and the edge of the body region itself is covered by a thin oxide layer, the gate oxide, and by a polysilicon layer, the gate layer, and forms a channel region of the elementary functional unit. The source regions of all the elementary functional units are contacted by a metal layer constituting a source electrode of the power device. Typically, the body regions have a square plan, and the power device is made up of a bidimensional array of square-plan elementary cells. Another conventional layout provides for hexagonal-plan elementary cells.

Typically, each elementary cell has a parasitic vertical bipolar junction transistor (BJT) having emitter, base and collector respectively represented by the source region, the portion of the body region under the source region, and the lightly doped semiconductor layer (an NPN transistor in the case of an N-channel power device). For a correct working of the power device, it is often important to prevent such a parasitic transistor from being triggered on. In the case of a power MOSFET, the parasitic transistor can lower the breakdown voltage of the power device. In the case of an IGBT, two complementary parasitic bipolar transistors are present, forming a parasitic SCR which, if triggered on, can cause the destruction of the power device.

A common technique used to prevent the triggering on of the parasitic bipolar transistor associated with the source and body regions provides for short-circuiting them in each elementary cell. The base-emitter junction of the parasitic transistor is thus short-circuited. In this condition the parasitic transistor breakdown voltage is $BV_{CES}$ (breakdown voltage between collector and emitter with the base short-circuited to the emitter).

Usually, the body region has a central heavily doped region (sometimes called the deep body region) and a lateral lightly doped channel region. The source region has an annular shape and is formed in the lateral channel region, substantially around the deep body region. The source metal layer which contacts the source region also contacts the deep body region of all the elementary cells.

A conventional manufacturing process includes: epitaxially growing a lightly doped semiconductor layer of a first, e.g. N, conductivity type over a heavily doped substrate of the N conductivity type, in the case of a power MOSFET, or of the P conductivity type, in the case of an IGBT; implanting, by use of a mask, and diffusing a heavy dose of a P type dopant into selected regions of the N type layer, to form the deep body regions of the elementary cells; thermally growing a thin oxide layer over the surface of the N type layer; depositing a polysilicon layer over the thin oxide layer; selectively etching the polysilicon layer around the deep body regions; implanting a low dose of a P type dopant using the polysilicon layer as a mask; diffusing the P type dopant to form channel regions extending under the thin oxide layer; and implanting, by use of a mask, a heavy dose of an N type dopant into the deep body and channel regions of the cells to form annular source regions.

The doping level of the deep body regions must be suitable to obtain low-resistance metal-semiconductor contact regions for the body regions, while the doping level of the channel regions is adjusted on the basis of the threshold voltage value desired for the power device. Typical implantation doses are in the range of $10^{13}$–$10^{14}$ atoms/cm$^2$ for the channel regions, and $10^{15}$ atoms/cm$^2$ for the deep body regions. Three distinct masks are necessary to introduce the dopants for the various regions of the elementary cells. The windows opened in the implantation mask for the deep body regions are smaller than the windows opened by etching in the polysilicon layer to avoid lateral diffusion of the heavily doped deep body regions during the thermal steps which can alter the doping profile of the channel regions. The source regions are implanted in a self-aligned way with the edges of the windows in the polysilicon layer, but the implantation mask must further provide unexposed surface regions in the middle of the deep body regions.

Often, in the elementary cell, the source region extends a significant distance into the lightly doped portion of the body region. Since the portion of the body region near the channel region under the source region has a relatively high sheet resistance (in the range of 600 ohm/square), the short-circuit of the base-emitter junction of the parasitic bipolar transistor becomes less effective as the lateral distance from the deep body region increases (a resistor is introduced between the emitter and the base regions of the parasitic transistor, and its breakdown voltage lowers to $BV_{CER}$, the breakdown voltage between collector and emitter with a resistor R connected between base and emitter). It is therefore desirable to make the deep body region extend as far as possible under the source region. However, due to the lateral diffusion of the deep body region dopants during the thermal steps of the fabrication process, the dopant profile in the channel region may be altered and the threshold voltage of the power device may not be readily controlled. Thus, in current MOS-technology power devices, the region near the edge of the source region to the channel region of the elementary cells is critical from the point of view of the parasitic transistor triggering on.

SUMMARY OF THE INVENTION

The aforementioned problems of the prior art are overcome by an illustrative embodiment of the present invention which provides a MOS-technology power device and the method of making same. The method includes the steps of: forming a conductive insulated gate layer on a surface of a lightly doped semiconductor material layer of a first conductivity type; removing the insulated gate layer from selected portions of the semiconductor material layer surface; implanting a dose of a first dopant of a second conductivity type into the selected portions of the semiconductor material layer, the insulated gate layer acting as a mask, so that the peak concentration of the first dopant is located at a prescribed distance from the semiconductor material layer surface; performing a thermal diffusion of the implanted first dopant with a thermal budget sufficient to form body regions, each body region including a first, heavily doped portion substantially aligned with the edges of the insulated gate layer, and a second, lightly doped portion formed by lateral diffusion of the first dopant under the insulated gate layer to form a channel region; and implanting a heavy dose of a second dopant of the first conductivity type into the first, heavily doped portions of the body regions, to form source regions substantially aligned with the edges of the insulated gate layer.

In another illustrative embodiment of the present invention, a method of making a MOS-technology power device includes the steps of: forming an insulated gate layer on a surface of a semiconductor material layer of a first conductivity type; removing the insulated gate layer to expose selected portions of the surface of the semiconductor material layer; implanting a first dose of a dopant of a second conductivity type into the selected portions of the semiconductor material layer to form a first implanted dopant, the insulated gate layer acting as a mask for the semiconductor material layer and the dopant being implanted at an energy so that a peak concentration of the first implanted dopant is located substantially at the surface of the semiconductor material layer; implanting a second dose of a dopant of the second conductivity type into the selection portions of the semiconductor layer material to form a second implanted dopant, wherein the second dose is greater than the first dose; thermally diffusing the first implanted dopant and the second implanted dopant, to form body regions, each body region comprising a heavily doped portion substantially aligned with edges of the insulated gate layer and a lightly doped portion extending under the insulated gate layer; and implanting a third dopant of the first conductivity type into the heavily doped portions of the body regions to form source regions in each heavily doped portion, each source region having an outside edge substantially aligned with corresponding edges of the insulated gate layer.

Due to the manufacturing process according to the present invention, the source regions of the elementary cells are almost completely included in the heavily doped portion of the body regions rather than in the lightly doped channel regions. The base series resistance of the parasitic vertical BJT having emitter and base respectively represented by the source region and the underlying portion of heavily doped body region of each cell is therefore negligible. This characteristic is further enhanced by the fact that, by adjusting the implantation energy, the dopant concentration in the heavily doped portion of the body region can have a peak located under the source region rather than at the surface of the semiconductor layer. The base series resistance of the parasitic BJT is thus further reduced so that the base/emitter junction of the BJT is effectively short-circuited not only externally by the source metal electrode which contacts the surface of the source regions and of the heavily doped portion of the body regions of the cells, but also internally.

The threshold voltage of the cells, (i.e., the doping level of the channel regions), is adjusted by controlling the implantation dose and energy of the body region, and the temperature and length of the thermal diffusion process herein defined as the thermal budget.

The process according to the invention also allows a reduction in the number of masks used with respect to the conventional processes.

BRIEF DESCRIPTION OF THE DRAWINGS

The features of the present invention will be made more evident by the following detailed description of a particular embodiment, illustrated as a non-limiting example in the annexed drawings, in which:

FIG. 7 shows a dopant concentration profile along the direction of the z axis of FIG. 4;

FIG. 8 shows a dopant concentration profile along the direction of the z axis of FIG. 1; and FIG. 9 shows a dopant concentration profile along the direction of the x axis of FIG. 1.

DETAILED DESCRIPTION

Figure 1:
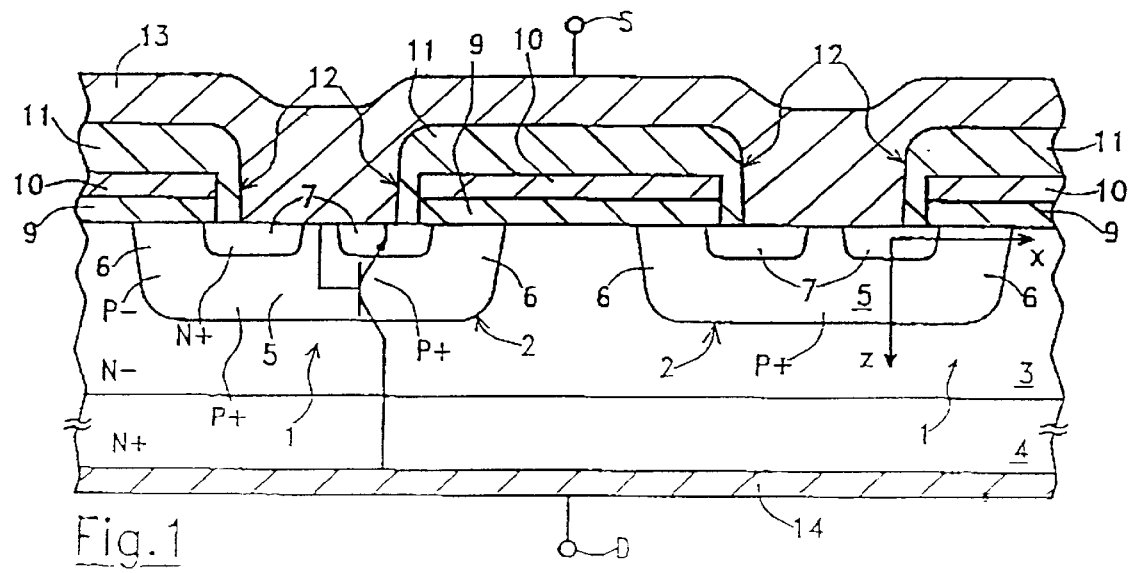
FIG. 1 is a cross-sectional view of a MOS-technology power device according to the present invention.

FIG. 1 shows a cross-section of a power MOSFET. The power MOSFET is made of a plurality of elementary functional units 1 each having a P type body region 2 formed in a lightly doped N type ("N−") epitaxial layer 3 grown over a heavily doped N type ("N+") substrate 4. The elementary functional units are, for example, square-plan elementary cells.

The P type body region 2 of each elementary cell 1 includes a first, heavily doped ("P+") portion 5, and a second, more lightly doped ("P−") lateral portion 6 forming a channel region of the elementary cell 1.

Each cell 1 also includes an N+ source region 7 formed in the heavily doped portion 5 of the body region 2 having an annular shape. An insulated gate layer, having a polysilicon gate layer 10 superimposed over a thin gate oxide layer 9, extends between adjacent elementary cells 1 and covers the surface of the channel region 6 of the body region 2. The heavily doped portion 5 of the body region 2 and the source region 7 are both substantially aligned with the edges of the insulated gate layer.

The insulated gate layer is covered by an insulation layer 11, such as PVapox. Contact windows 12 are opened over the source region 7 and the heavily doped portion 5 of the body region 2, to allow a superimposed metal layer 13 to contact them. The metal layer 13 contacts all the elementary cells, and forms a source electrode S of the power MOSFET. A drain electrode D is also formed by covering the bottom surface of the substrate 4 by a metal layer 14.

FIGS. 8 and 9 show the dopant concentration profiles in the different cell regions. Na and Nd are the concentrations of acceptors (P type regions) and donor (N type regions) dopants, respectively. FIG. 8 represents an ideal section along the direction of the z axis of Fig. 1, whereas FIG. 9 is an ideal section along the x axis of FIG. 1 (i.e., along the channel of the cell 1).

Since the source region 7 is almost completely internal to the heavily doped portion 5 of the body region 2, the base series resistance of the parasitic vertical BJT having emitter and base represented by the source region 7 and the underlying portion of the body region 2 is negligible even near the external edge of the source region. The base/emitter junction of such a parasitic BJT is thus effectively short-circuited by the metal layer 13 to prevent the parasitic BJT from being triggered on. Thus, the breakdown voltage of the power MOSFET is not reduced.

Figure 2:
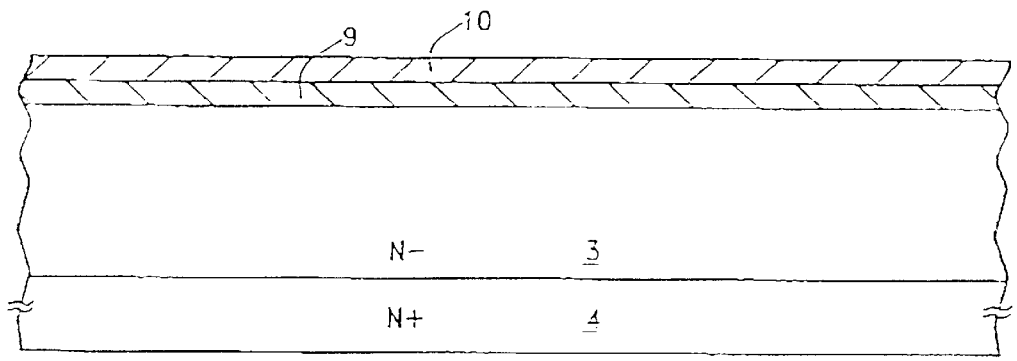
FIGS. 2–6 are cross-sectional views taken at intermediate process steps according to the present invention.
Figure 3:
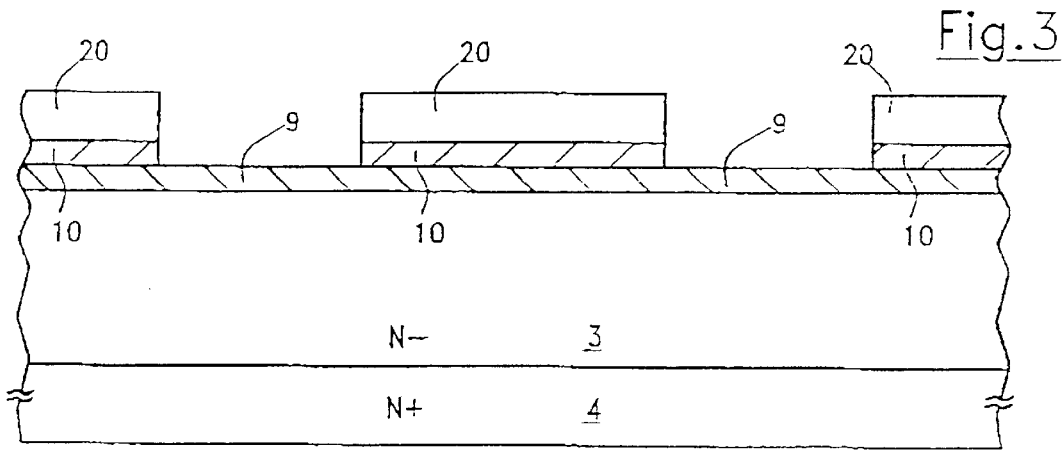

A manufacturing process according to an embodiment of the present invention starts with the epitaxial growth of a lightly doped N type layer 3 over a heavily doped N type substrate 4. The surface of the N− layer 3 is then covered by a thin gate oxide layer 9 (e.g. thermally grown), over which a polysilicon gate layer 10 is formed (e.g. by deposition). In this way, an insulated gate layer is formed (FIG. 2). The polysilicon layer 10 is then selectively removed from the surface of the thin gate oxide layer 9. This step is performed by covering the insulated gate layer with a photoresist 20, and removing photoresist 20 from the regions of the insulated gate layer surface which are to be exposed to the action of an etchant with high selectivity towards polysilicon relative to the photoresist material (FIG. 3). At this step the thin gate oxide layer 9 may be selectively removed together with the polysilicon layer 10.

Figure 4:
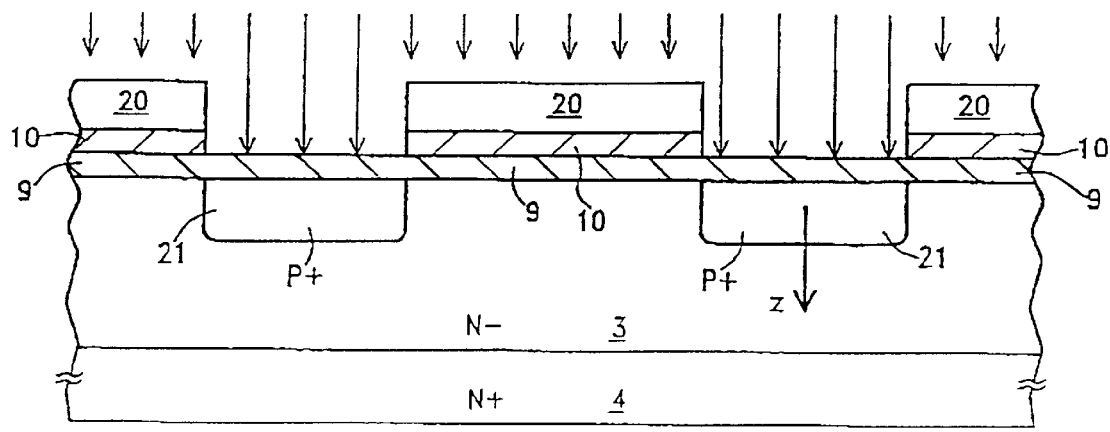

As show in FIG. 4, a heavy dose of a P type dopant (such as boron) is then selectively implanted at high energy into the N− layer 3, the insulated gate layer (and, if necessary, the superimposed photoresist 20) acting as a mask for the implanted dopant ions. Due to the high implantation energy, P type regions 21 are obtained wherein the distribution of implanted ions has a peak located at a prescribed distance from the surface of the N− layer 2, depending on the implantation energy. For example, the dopant ions can be implanted in a dose of $10^{14}$–$10^{15}$ atoms/cm$^2$ with an energy ranging from 100 to 200 KeV. Moreover, since the insulated gate layer is used a mask, said P type regions 21 are laterally self-aligned with the edges of the insulated gate layer (FIGS. 4 and 7).

Figure 5:
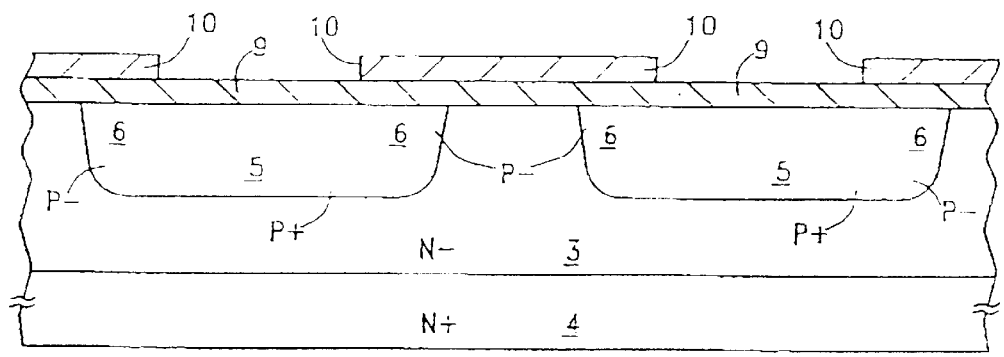

The implanted ions are then made to diffuse by means of a thermal process. The temperature and time duration (i.e., the thermal budget) of the thermal process determine the amount of diffusion. The vertical diffusion of the dopant ions allows the formation of heavily doped P type regions 5, while the lateral diffusion of the dopant ions forms lightly doped channel regions 6 under the insulated gate layer (FIG. 5). With the dose and energy values previously cited, a suitable thermal budget is in the range 1050°–1100° C. for 0.5–2 hours. Under these conditions, channel lengths of 0.5–1 μm can be obtained.

Figure 4A:
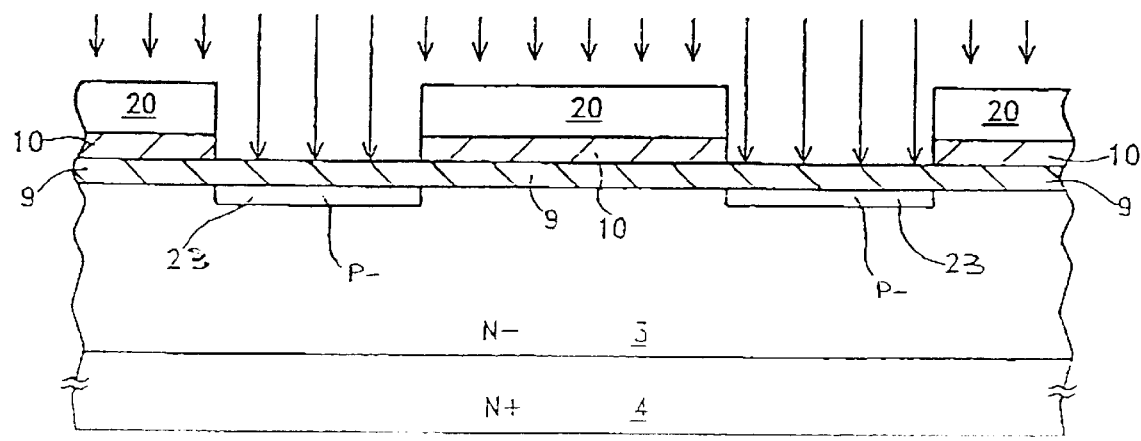
Figure 4B:
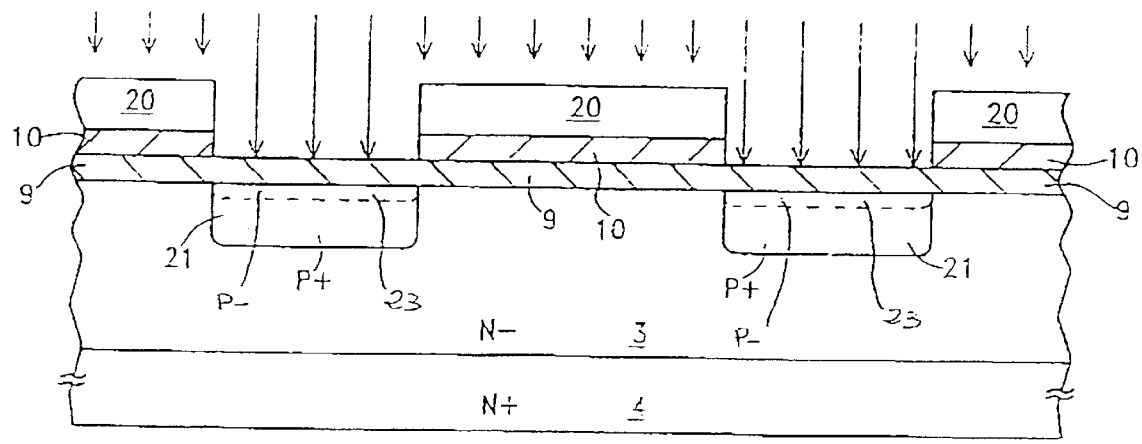

Alternatively, as shown in FIGS. 4A and 4B, the heavily doped P type regions 5 and lightly doped channel regions 6 can be formed by two distinct implants of P type dopants, in different doses and at different energies. The insulated gate layer (and, if necessary, the superimposed photoresist layer 20) may act as a mask for both implants.

For example, the first implant can involve a dose of boron in the range $10^{13}$–$10^{14}$ atoms/cm$^{-2}$ with an energy of approximately 80 keV. The energy level is used to control the dopant concentration at the surface of the body regions, especially in channel regions 6, to set the desired threshold voltage of the MOS power device. After this first implant, lightly doped shallow P− regions 23 are obtained (FIG. 4A).

The second implant involves, for example, a dose of boron in the range $10^{14}$–$10^{15}$ atoms/cm$^{-2}$ with an energy between 100 keV and 300 keV. This implantation energy is such that peak concentration of the dopant can be located under source regions 7 which are formed in a later step. After this step, heavily doped deep P+ regions 21 are obtained (FIG. 4B).

A subsequent thermal diffusion process at a temperature in the range 1050°–1150° C. for 0.5 to 2 hours determines the lateral diffusion of the dopant introduced with the first implant and forms the lightly doped channel regions 6 of body regions 2 which extend under the insulated gate layer. The vertical diffusion of the dopant introduced by the second implant does not alter the threshold voltage of the MOS power device because the dopant ions reach the surface with a concentration lower than the concentration of the dopant introduced by the first implant and because the peak dopant concentration of the dopant introduced by the first implant is located substantially at the surface of the N− layer 3. The vertical and lateral diffusion of the dopant introduced by the second implant lead to the formation of heavily doped P type regions 5, which reduce the resistivity of body regions 2 under surface region 7.

Figure 6:
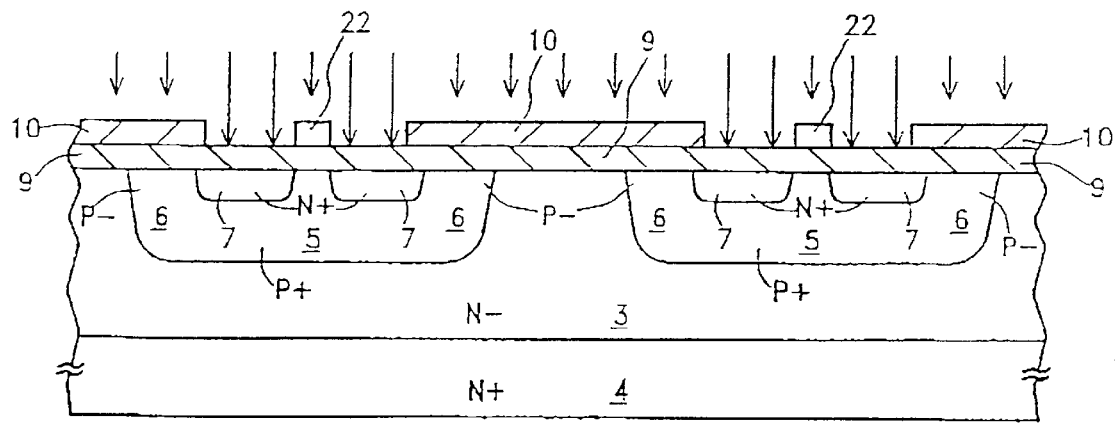

As shown in FIG. 6, a heavy dose of an N type dopant is then selectively introduced into the heavily doped regions 5, for example by ion implantation. The implantation mask is provided in part by the insulated gate layer, but may further include photo resist isles 22 within regions 5 to prevent the ions from being implanted in the central portions of the regions 5 which will be contacted by a metal layer (FIG. 6).

After dopant diffusion, annular source regions 7, self-aligned with the insulated gate layer and substantially internal to the heavily doped regions 5, are formed. The portions of the thin gate oxide layer 9 not covered by the polysilicon layer 10 are then removed. An insulation layer 11 is formed over the insulated gate layer, and it is selectively removed to open contact windows 12 over the elementary cells 1. The insulation layer 11 is covered by a metal layer 13 which contacts the source region 7 and the heavily doped region 5 of all the elementary cells 1. A metal layer 14 is also formed on the bottom surface of the N+ substrate 4.

The process according to the present invention applies as well to the fabrication of IGBTs, one difference being the conductivity type of the substrate.

Further, the process according to the present invention is not limited to MOS-technology power devices made up of arrays of square-plan elementary cells as those previously described, but extends to high-density devices made up of a plurality of elementary functional units, wherein the body region is an elongated stripe with one dimension much greater than the other, and the source region has two regions elongated in the same direction as the body region, and a plurality of transversal regions. Such a device is described in the co-pending European Patent Application No. 94830288.0.

Having thus described at least one illustrative embodiment of the invention, various alterations, modifications, and improvements will readily occur to those skilled in the art. Such alterations, modifications, and improvements arc intended to be within the spirit and scope of the invention. Accordingly, the foregoing description is by way of example only and is not intended as limiting. The invention is limited only as defined in the following claims and the equivalents thereto.

What is claimed is:

1. A process for manufacturing a MOS-technology power device, the process comprising the steps of:
   a) forming an insulated gate layer on a surface of a semiconductor material layer of a first conductivity type;
   b) removing the insulated gate layer to form exposed portions of the surface of the semiconductor material layer;
   c) implanting a first dopant of a second conductivity type through the exposed portions of the semiconductor material layer to form a first implanted dopant, the first dopant being implanted at an energy so that a peak concentration of the first implanted dopant is located a first distance from the surface of the semiconductor material layer;
   d) implanting a second dose of the first dopant of the second conductivity type through the exposed portions of the semiconductor material layer to form a second implanted dopant, the dopant being implanted at an energy so that a peak concentration of the second implanted dopant is located at a second distance from the surface of the semiconductor material, wherein the second distance is greater than the first distance;

e) thermally diffusing the first implanted dopant and the second implanted dopant to form body regions, each body region comprising a heavily doped portion substantially aligned with edges of the insulated gate layer and a lightly doped portion under the insulated gate layer; and f) implanting a third dopant of the first conductivity type into the heavily doped portions of the body regions to form source regions in each heavily doped portion, each source region having an outside edge substantially aligned with corresponding edges of the insulated gate layer.

2. The process according to claim 1, wherein step c) includes implanting a first dose having a range from about $10^{13}$ to about $10^{14}$ atoms/cm$^2$.

3. The process according to claim 1, wherein step d) includes implanting a second dose having a range from about $10^{14}$ to about $10^{15}$ atoms/cm$^2$.

4. The process according to claim 1, wherein step e) includes diffusing the implanted first dopant and the implanted second dopant at a temperature in a range from about 1050° C. to about 1150° C. for from about 0.5 to about 2 hours.

5. The method according to claim 1, wherein step e) includes thermally diffusing the first implanted dopant and the second implanted dopant so that the first implanted dopant forms the lightly doped portion.

6. The method according to claim 1, wherein step e) includes thermally diffusing the first implanted dopant and the second implanted dopant so that the second implanted dopant forms the heavily doped portion.

7. The process according to claim 1, further comprising the steps of:

g) covering the insulated gate layer and the exposed portions of the semiconductor material layer surface with an insulating material layer;

h) creating contact windows in the insulating material layer over the exposed portions of the semiconductor material layer surface; and i) covering the insulating material layer with a conductive material layer.

8. The process according to claim 1, wherein step a) includes growing a thin oxide layer over the surface of the semiconductor material layer and covering the thin oxide layer with a conductive material layer.

9. The process according to claim 8, wherein the conductive material is a polysilicon layer.

10. The process according to claim 1, further comprising before step a), the step of growing an epitaxial layer over a heavily doped semiconductor material substrate to form the semiconductor material layer.

11. The process according to claim 10, wherein the semiconductor material substrate has dopants of the first conductivity type so that the power device is a power MOSFET.

12. The process according to claim 10, wherein the semiconductor material substrate has dopants of the second conductivity type so that the power device is an IGBT.

13. The process according to claim 1, wherein the first conductivity type is N type and the second conductivity is P type.

14. The process according to claim 1, wherein the first conductivity type is P type and the second conductivity is N type.

15. A process of forming a semiconductor device, comprising the steps of:

disposing an insulated gate layer over portions of a semiconductor material layer of a first conductivity type to leave exposed portions of the surface of the semiconductor layer; and forming a deep body region in the exposed portions of the surface of the semiconductor material layer and a channel region in the semiconductor material layer under an insulated gate oxide layer, the forming step includes the steps of:

implanting a first dose of a dopant of a second conductivity type to form a first implanted dopant located a first distance from the surface of the semiconductor material layer;

implanting a first dose of the dopant of the second conductivity type to form a second implanted dopant located a second distance from the surface of the semiconductor material layer, the second distance being greater than the first distance; and thermally diffusing the first implanted dopant and the second implanted dopant in the semiconductor material layer.

16. The process according to claim 15, further comprising the step of implanting a third dopant of the first conductivity type into the deep body regions to form source regions within the deep body regions.

17. The process according to claim 16, wherein the source regions are substantially aligned with edges of the insulated gate layer adjacent the exposed portions of the semiconductor material layer.

18. The process according to claim 16, wherein the source regions are substantially contained within the deep body regions.

19. The process according to claim 15, wherein the insulating gate layer acts as a mask for the semiconductor material layer for the implanting steps, wherein the first implanting step includes implanting the dopant at an energy so that a peak concentration of the first implanted dopant is located substantially at the surface of the semiconductor material layer, and wherein the second implanting step includes implanting the dopant at an energy so that a peak concentration of the second implanted dopant is located at a distance from the surface of the semiconductor material layer, and wherein the second dose is greater than the first dose.

20. The process according to claim 19, wherein the thermally diffusing step diffuses the first implanted dopant and the second implanted dopant to form body regions having a heavily doped portion and a lightly doped portion, the heavily doped portion having a periphery substantially aligned with edges of the insulated gate layer, the lightly doped portion being disposed under the insulated gate layer and along the periphery of the heavily doped portion.

21. The process according to claim 1, wherein the second dose is greater than the first dose.

22. A process for manufacturing a MOS-technology power device, the process comprising the steps of:

providing a semiconductor material layer of a first conductivity type having a surface, an insulated gate layer being disposed on portions of the surface of the semiconductor material layer to form covered portions of the surface of the semiconductor material layer and exposed portions of the surface of the semiconductor material layer;

implanting a first dose of a dopant of a second conductivity type through the exposed portions of the semiconductor material layer at a first energy to form a first region containing the implanted dopant from the first dose, the first region being located a first distance from the surface of the semiconductor material layer;

implanting a second dose of the dopant of the second conductivity type through the exposed portions of the semiconductor material layer at a second energy to form a second region containing the implanted dopant from the second dose, the second region being located a second distance from the surface of the semiconductor material, the second distance being greater than the first distance.

23. The process according to claim 22, further comprising the step of thermally diffusing the implanted dopant in the first and second regions to form body regions, each body region comprising a heavily doped portion substantially aligned with edges of the insulated gate layer and a lightly doped portion under the insulated gate layer.

24. The process according to claim 23, further comprising the step of implanting a third dopant of the first conductivity type into the heavily doped portions of the body regions to form source regions in each heavily doped portion, each source region having an outside edge substantially aligned with corresponding edges of the insulated gate layer.

25. The process according to claim 22, wherein the first dose is implanted in a range from about $10^{13}$ to about $10^{14}$ atoms/cm$^2$.

26. The process according to claim 22, wherein the second dose is implanted in a range from about $10^{14}$ to about $10^{15}$ atoms/cm$^2$.

27. The process according to claim 22, wherein the step of thermally diffusing includes thermally diffusing the implanted dopant in the first and second regions at a temperature in a range from about 1050° C. to about 1150° C. for from about 0.5 to about 2 hours.

28. The method according to claim 22, wherein the step of thermally diffusing includes thermally diffusing the implanted dopant in the first and second regions so that the first implanted dopant forms the lightly doped portion.

29. The method according to claim 22, wherein the step of thermally diffusing includes thermally diffusing the implanted dopant in the first and second regions so that the second implanted dopant forms the heavily doped portion.

30. The method according to claim 22, wherein the second energy is greater than the first energy.

* * * * *

UNITED STATES PATENT AND TRADEMARK OFFICE
CERTIFICATE OF CORRECTION

PATENT NO. : 5,817,546

DATED : October 6, 1998

INVENTOR(S): Giuseppe Ferla and Ferruccio Frisina

It is certified that error appears in the above-identified patent and that said Letters Patent is hereby corrected as shown below:

On the title page, item [73] should read:

[73] Assignees: SGS-Thomson Microelectronics S.r.l., Agrate Brianza; Consorzio per la Ricerca sulla Microelettronica nel Mezzogiorno, Catania, both of Italy Signed and Sealed this Seventh Day of September, 1999

Attest:

Q. TODD DICKINSON

Attesting Officer      Acting Commissioner of Patents and Trademarks